United States Patent [19]

Van Maren et al.

[11] Patent Number: 4,870,415
[45] Date of Patent: Sep. 26, 1989

[54] DATA COMPRESSION SYSTEM WITH EXPANSION PROTECTION

[75] Inventors: David J. Van Maren, Fort Collins; Jeff J. Kato, Greeley, both of Colo.

[73] Assignee: Hewlett-Packard Company, Palo Alto, Calif.

[21] Appl. No.: 109,969

[22] Filed: Oct. 19, 1987

[51] Int. Cl.⁴ .......................................... H03M 7/30
[52] U.S. Cl. ...................................... 341/94; 341/51; 364/900; 364/926.3
[58] Field of Search ................. 340/347 DD; 358/260, 358/261, 257, 263, 280; 382/56; 235/310; 364/926.1, 926.2, 926.3, 926.6; 341/51, 55, 63, 71, 87, 94, 95

[56] References Cited

U.S. PATENT DOCUMENTS

| | | | |
|---|---|---|---|
| 4,145,686 | 3/1979 | McMurray et al. | 340/347 DD |
| 4,486,784 | 12/1984 | Abraham et al. | 340/347 DD |
| 4,654,877 | 3/1987 | Shimoni et al. | 382/56 |
| 4,719,514 | 1/1988 | Kurahayashi et al. | 358/260 |
| 4,772,955 | 9/1988 | Kurahayashi et al. | 358/257 |

Primary Examiner—William M. Shoop, Jr.
Assistant Examiner—Brian K. Young
Attorney, Agent, or Firm—William W. Cochran, II

[57] ABSTRACT

A data compression system implementing expansion protection employs one or more pairs of FIFOs to compare the lengths of raw and processed versions of a block of received data. The shorter version is transmitted so that the data transmitted by the data compression system is at most negligibly expanded relative to the system input. A code is inserted in the output stream to indicate the beginning of the transmission of a raw data block so that a receiving or retrieving system can determine whether the data following needs to be decompressed or not. Further codes can be injected to indicate a switch from raw data to processed data in the output of the compression system.

6 Claims, 2 Drawing Sheets

DATA COMPRESSION SYSTEM WITH EXPANSION PROTECTION

BACKGROUND OF THE INVENTION

The present invention relates to signal processing and, more particularly, to data compression.

Data compression is the reversible re-encoding of information into a more compact expression. This more compact expression permits information to be stored and/or communicated more efficiently, generally saving both time and expense. A typical encoding scheme, e.g., based on ASCII, encodes alphanumeric characters and other symbols into binary sequences. A major class of compression schemes encodes symbol combinations using binary sequences not otherwise used to encode individual symbols. Compression is effected to the degree that the symbol combinations represented in the encoding scheme are encountered in a given text or other file. By analogy with bilingual dictionaries used to translate between human languages, the device that embodies the mapping of uncompressed code into compressed code is commonly referred to as a "dictionary".

The present invention is primarily applicable to dictionary-based compression schemes, which are part of a larger class of sequential compression schemes. These are contrasted with non-sequential schemes which examine an entire file before determining the encoding to be used. Other sequential compression schemes, such as run-length limited (RLL) compression, can be used in conjunction with adaptive schemes.

Generally, the usefulness of a dictionary-based compression scheme is dependent on the frequency with which the symbol-combination entries in the dictionary are matched as a given file is being compressed. A dictionary optimized for one file type is unlikely to be optimized for another. For example, a dictionary which includes a large number of symbol combinations likely to be found in newspaper text files is unlikely to compress effectively data base files, spreadsheet files, bit-mapped graphics files, computer-aided design files, Musical Instrument Data Interface (MIDI) files, etc.

Thus, a strategy using a single fixed dictionary might be best tied to a single application program. A more sophisticated strategy can incorporate means for identifying file types and selecting among a predetermined set of dictionaries accordingly. Even the more sophisticated fixed dictionary schemes are limited by the requirement that a file to be compressed must be matched to one of a limited number of dictionaries. Furthermore, there is no widely accepted standard for identifying file types essentially limiting multiple dictionary schemes to specific applications or manufacturers.

Adaptive compression schemes are known in which the dictionary used to compress a given file is developed as that file is being compressed. Entries are made into a dictionary as symbol combinations are encountered in the file. The entries are used on subsequent occurrences of an encoded combination. Compression is effected to the extent that the symbol combinations occurring most frequently in the file are encountered as the dictionary is developing. Systems incorporating adaptive compression schemes can include means for clearing the dictionary between files so that the dictionary can be adapted on a file-by-file basis.

Adaptive compression systems and methods are disclosed in U.S. Pat. No. 4,464,650 to Eastman et al. and U.S. Pat. No. 4,558,302 to Welch. These references explain further the use of dictionaries in both adaptive and non-adaptive compression strategies. Further pertinent references to compression strategies include: G. Herd, "Data Compression: Techniques and Applications—Hardware and Software Considerations, Wiley, 1983; R. G. Gallagher, "Variations on a Theme of Huffman", IEEE Transactions on Information Theory, Vol. IT-24, No. 6, pp. 668–674, November 1978; J. Ziv and A. Lampel, "A Universal Algorithm for Sequential Data Compression", IEEE Transactions on Information Theory, Vol. IT-23, No. 3, pp. 337–343, May 1977; J. Ziv and A. Lampel, "Compression of Individual Sequences via Variable Rate Coding", IEEE Transactions of Information Theory, Vol. IT-24, No. 5, pp. 530–536, September 1978; and T. A. Welch, "A Technique for High Performance Data Compression", IEEE Computer, June 1984.

A disadvantage of such adaptive compression techniques is that in some cases they can expand rather than compress the data. In fact expansion is the rule rather than the exception when an adaptive compression scheme is used to compress a file which has already been compressed by that scheme. As data compression becomes more widely employed, the chances of data expansion due to an attempted compression of a previously compressed file increases. For example, an application program can include a dedicated compression scheme so that files created by the program can be stored efficiently on a hard disk drive. Likewise, a tape drive system for backing up a hard disk include a data compression scheme in hardware for more efficient archiving of the hard disk drive. In this situation, attempting data compression during archiving can result in data expansion rather than contraction.

As data compression becomes more common, this counterproductive scenario becomes less the exception and more the rule. If data compression is to be implemented in hardware so that it operates irrespective of the type of data being compressed, it becomes necessary to protect against unintended data expansion. Of course, this protection must not interfere with the process of decompression that must occur upon the reception or retrieval of compressed data.

SUMMARY OF THE INVENTION

The present invention provides expansion protection in a data compression system by selecting the shorter of (1) the "raw" data as received by the system, and (2) the "processed" data as processed by an incorporated data compressor. A data compression system in accordance with the present invention includes a data compressor, a control function, and one or more pairs of buffers. Each pair of buffers includes a buffer for raw data and a buffer for processed data. When the raw data buffer is first to fill, data is transmitted from the processed data buffer, and vice-versa.

As just indicated, when a processed data buffer is first to fill, the contents of the raw data buffer are to be transferred. Prior to this transmission, a code can be injected to indicate that the data following is raw data. Upon reception or retrieval of the data file, this code can be used by a decompression system to determine when decompression is required and when it is not. Additional codes can be used to indicate the resumption or non-resumption of data compression.

Accordingly, the present invention provides for expansion protection with minimal performance overhead. This greatly improves the commercial viability of general purpose hardware implementations of adaptive compression schemes. In addition, the invention is applicable to compression schemes other than those using adaptive dictionaries. Other features and advantages of the present invention are apparent from the description below with reference to the following drawings.

DESCRIPTION OF THE PREFERRED EMBODIMENTS

Figure 1:
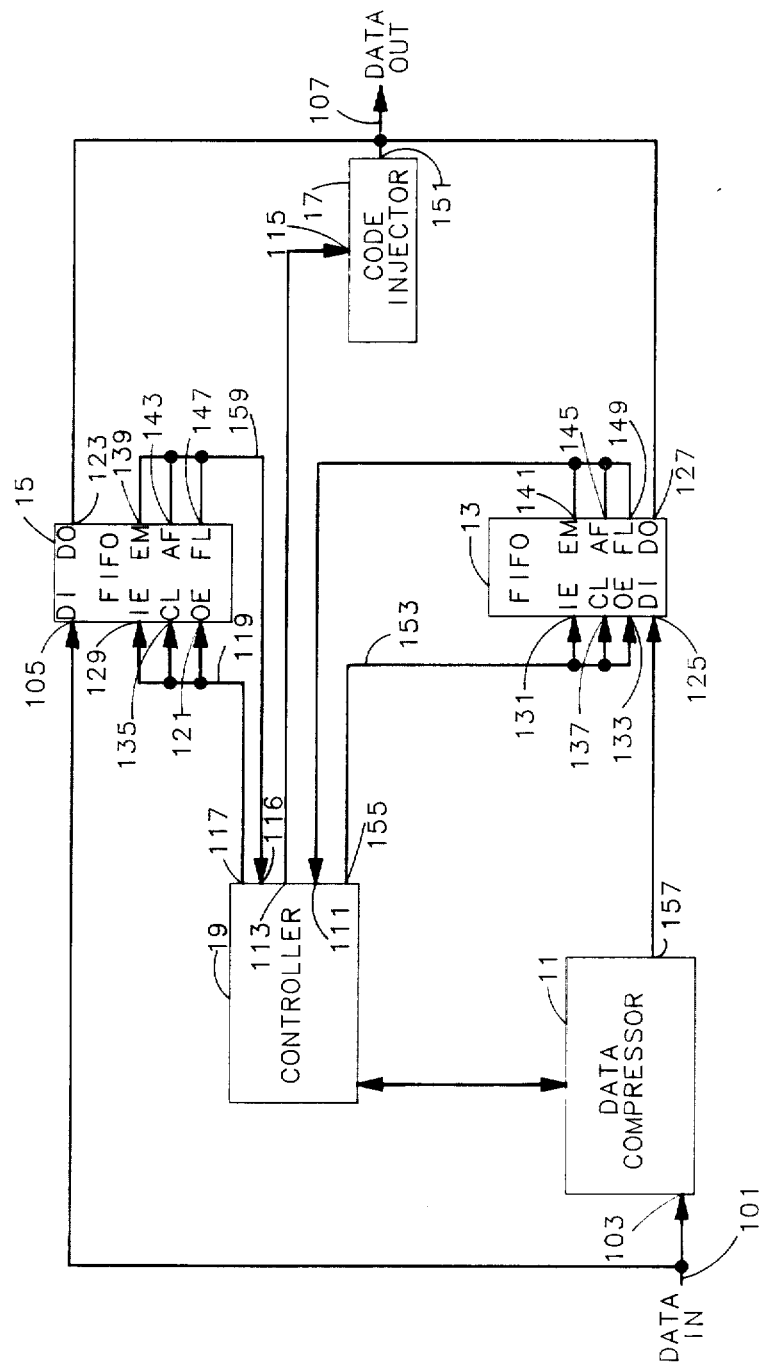
FIG. 1 is a data compression system with expansion protection in accordance with the present invention.
Figure 2:
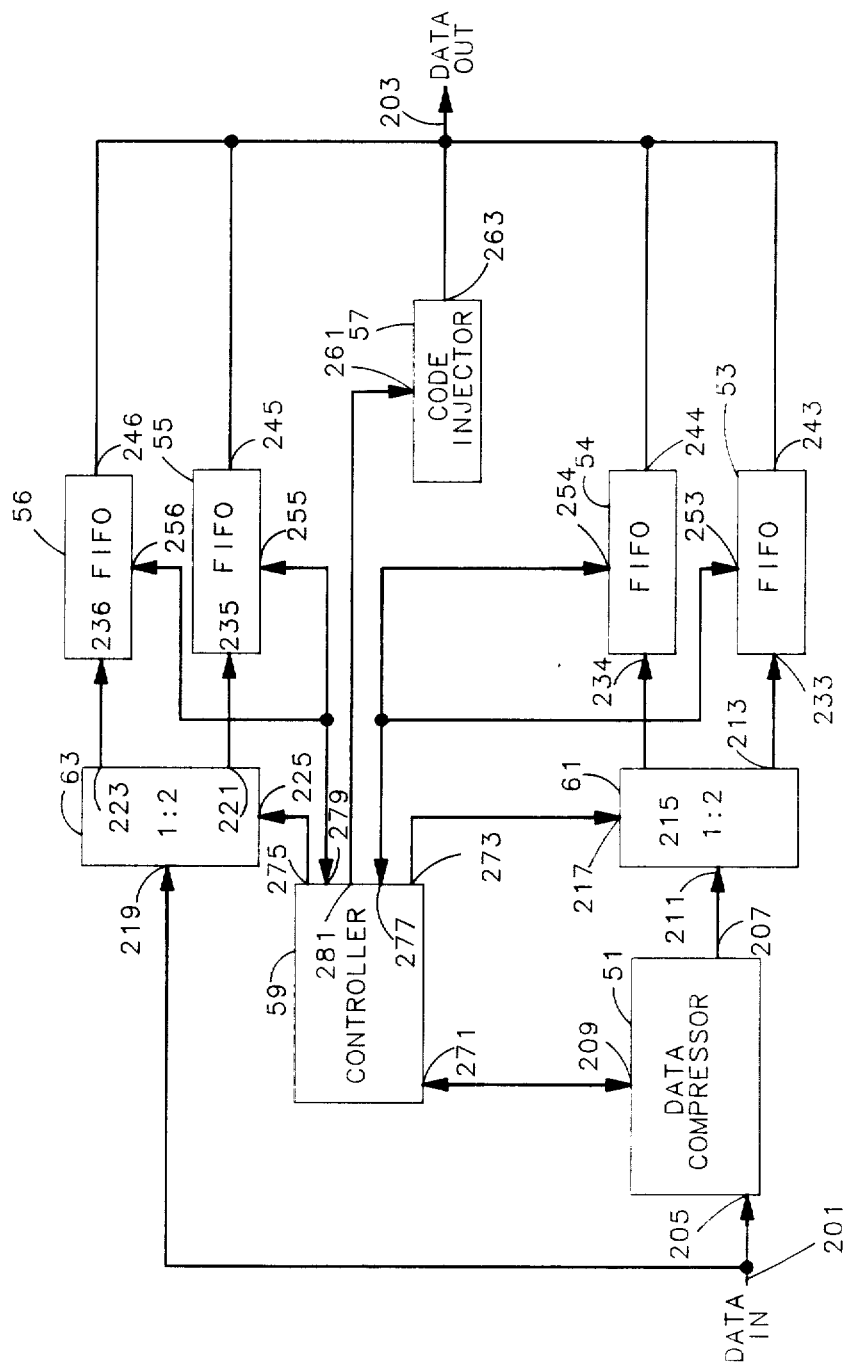
FIG. 2 is an alternative data compression system with expansion protection in accordance with the present invention.

A data compression system includes a data compressor 11, a "processed data" first-in first-out memory (FIFO) 13, a "raw data" FIFO 15, a code injector 17 and a controller 19. Raw data from a host system is received along a "data in" line 101 of the data compression system and is directed to an input 103 of compressor 11 and a data input 105 of raw data FIFO 15 concurrently. The data, as processed by the compressor 11, is entered into the processed data FIFO 13.

As long as compressor 11 is effectively compressing received data, the data path through the data compression system includes compressor 11 processed data FIFO 13, and the data out line 107 of the data compression system. If compressor 11 is expanding rather than compressing data over a sufficiently long data block, processed data FIFO 13 is filled before raw data FIFO 15. In this case, a full indication from an output 109 of processed data FIFO 13 to an input 111 of controller 19 causes the latter to transmit a signal from an output 113 to an input 115 to activate code injector 17 so that a code indicating that raw data follows is injected into the output data stream through line 107. Next, controller 19 transmits from an output 117 via a bus 119 to an output enable port 121 to signal raw data FIFO 15 to transmit raw data via data out line 107 of the data compression system.

The illustrated data compressor 11 employs an adaptive compression strategy, using a dictionary with both preassigned and assignable codes. The preassigned codes are associated with individual symbols expected in the data stream. Certain symbol combinations, selected according to the adaptive strategy, are assigned codes as the combinations are encountered in the raw data stream from the host system. At least 90% of the four thousand codes available in the dictionary of compressor 11 are assignable to symbol combinations. An assigned code is used to translate the respective symbol combination on subsequent occurrences of that combination in the symbol stream.

FIFOs 13 and 15 are similar, each having a data input port 125, 105, a data output port 127, 123, an input enable port 131, 129, an output enable port 133, 131, a clear input 137, 135, an empty indicator 141, 139, an almost full indicator 145, 143, and a full indicator 149, 147. Each of the FIFOs receives data via its data input port 125, 105 when it is enabled. Each data output port 127, 123, when enabled, can transmit the contents of the respective FIFO 13, 15 via data out line 107 from the data compression system. For each FIFO 13, 15, the respective input enable 131, 129 and the respective output enable 133, 121 are used to enable the respective data input port 125, 105 and the respective data output port 127, 123. Each clear input 137, 135, when activated, sets a pointer in the respective FIFO 13, 15 to indicate that no data is contained therein. When no data is contained in a FIFO 13, 15, the respective empty indicator 141, 139 is activated. When a FIFO 13, 15 is full, the respective full indicator 149, 147 is activated. Provision is also made to indicate an almost full condition at the respective almost full indicator 145, 143. The illustrated FIFOs 13 and 15 have 1 kilobyte capacities.

Code injector 17 can inject from its output 151 a predetermined code into the data output stream in response to a signal at its enable port 115. This predetermined code is selected to be distinguishable from any of the codes in the dictionary of compressor 11 assigned to individual symbols or symbol combinations in the data input stream. Thus the injected code can be identified on reception or retrieval as an indicator for a switch from processed data to raw data in the data stream. A decompression system can thus respond accordingly upon reception or retrieval of the compressed file.

Controller 19 coordinates the activities of the components of the data compression system so that compressed data is output therefrom as long as compressor 11 is compressing data and so that raw data is output therefrom once compressor 11 is found to be expanding received data. Using unillustrated connections, controller 19 provides handshaking with a host system as data is being received along data in line 101 and transmitted via data out line 107. Controller 10 also controls compressor 11 so that it receives data in coordination with the transmission of data by the host system.

The interface between compressor 11 and processed data FIFO 13 is also managed by controller 19, which controls via a bus 153 from an output 155 an output 157 of compressor 11 and data input port 125 of processed data FIFO 13, via its input enable port 131. Concurrently, controller 19 controls, using its output 117 and bus 119, the reception of raw data by the raw data FIFO 15 via its input enable port 129.

Further details of operation are apparent from the following typical sequence of events. It is assumed that the dictionary has been reset prior to the reception of data from the host system. As data is received along data in line 101, it is entered into raw data FIFO 15 and processed by compressor 11, the output of which is entered into processed data FIFO 13. Initially, the compression ratio of compressor 11 will be near 1:1 i.e., a raw data segment is about as long as the corresponding processed data segment.

As symbol combinations are encountered in the stream, some of them are selected according to the data compression strategy for assignment to assignable codes in the dictionary. As these combinations are reencountered encountered later in the stream, a single output code represents the raw data symbol combinations, effecting at least some data compression.

Assuming that the symbol combinations encoded in the adapted dictionary appear relatively frequently in the file being processed, raw data FIFO 15 fills more quickly than processed data FIFO 13. Accordingly, full indications from output 147 of raw data FIFO 15 are transmitted along bus 159 and received at an input 161 of controller 19. Controller 19 can then inhibit further compression activity and data entry into the FIFOs.

After receiving a full indication, controller 19 activates the output enable 133 of processed data FIFO 13 and the data contained therein is transmitted via data out line 107. Controller 19 signals compressor 11 to stop transmission as soon as a word boundary is reached. In the meantime, controller 19 activates clear input 135 of raw data FIFO 15, which confirms an empty condition with an empty indication via empty port 139. Once processed data FIFO 13 has transmitted all its data, it sends an empty indication to controller 19 which then requests further data from the host system and activates the input enables 129, 131 of the two FIFOs. The process repeats until compressor 11 starts expanding data rather than compressing data.

In the event compressor 11 begins to expand data, processed data FIFO 13 fills before raw data FIFO 15. In this case, an almost full indication from processed data FIFO 13 is sent to controller 19. Controller 19 then activates injector 17 which inserts the predetermined switch code into the data output stream. Controller 19 then activates the output enable 121 of raw data FIFO 15 so that raw data follows the inserted code. Controller 19 then clears processed data FIFO 13.

The system can be configured for a one-time switch to raw data transmission or to alternate between raw and processed data transmissions within a single data file. In the one-shot configuration, once the switch is made to raw data, raw data is transmitted until the file is completely transmitted. In this case, controller 19 simply forwards input data to the output line 107 via raw data FIFO 15.

In the alternating configuration, compressor 11 continues to operate and the output source is selected according to which FIFO fills first. In this case, controller 19 activates code injector 17 at the beginning and end of each block of raw data transmitted. Thus, if upon reception or retrieval two consecutive injector codes are detected, this indicates that raw data continues. If only one injector code is detected, the following bits can be taken to represent compressed data.

A second embodiment of the present invention incorporates two pairs of FIFOs which operate in shifts so that data compression need not be delayed while output is effected. In addition to a data compressor 51, a controller 59, four FIFOs 53, 54, 55 and 56, and a code injector 57, includes a pair of 1:2 demultiplexer switches 61 and 63 to shift between one pair of FIFOs and the other.

In this second data compression system, data is received along a data input line 201 and transmitted via a data output line 203. Data compressor 51 receives input data at an input 205 and transmits process data via its output 207. Data compressor 51 also includes a control port 209 for communication with controller 59.

Demultiplexer 61 includes an input 211 for receiving data as processed by data compressor 51, a first output 213 for transmitting data to FIFO 53, a second output 215 for transmitting data to FIFO 54, and a control input 61 for receiving select signals from controller 59. Demultiplexer 63 includes an input 219 for receiving data via data in line 201, a first output 221 for transmitting data to FIFO 55, a second output 223 for transmitting data to FIFO 56, and a control input 225 for receiving select signals from controller 59.

FIFOs 53 and 54 include respective data inputs 233 and 234 coupled to demultiplexer 61. FIFOs 55 and 56 include respective data inputs 234 and 236, each coupled to demultiplexer 63. FIFOs 53, 54, 55 and 56 include respective data outputs 243, 244, 245, 246 all coupled to data out line 203. Each FIFO also includes a respective control port 253, 254, 255, 256 for communication with controller 59. Code injector 57 includes a control input 261 and a code output 263.

Controller 59 includes a port 271 for bi-directional communication with data compressor 51. Controller 59 also has an output 273 for transmitting a select signal to demultiplexer 61 and an output 275 for transmitting a select signal to demultiplexer 63. Controller 59 additionally includes ports 277 and 279 for bi-directional communication with FIFOs 53, 54, 55 and 56. An output 281 is used to activate code injector 57.

In operation, raw data is received concurrently by compressor 51 and the upper 1:2 switch 63. Switches 61 and 63 are set by controller 59 to direct data to the lower respective FIFO, 53, 55. Thus raw data received at upper switch 63 is input to the lower raw data FIFO 55 and the output of compressor 51 is directed to the lower processed data FIFO 53. Once one of the two lower FIFOs 53, 55 are full, controller 59 changes the routing at switches 61 and 63 so that the next block of data is input to upper FIFOs 54 and 56. This switching is timed to permit any necessary word boundary cleanup by compressor 51. During this filling, the contents of the appropriate lower FIFO 54, 56 is transmitted via the data out line 203. Code injector 57 is activated as necessary to mark raw data as in the previous embodiment. The main advantage of this arrangement is that the data input stream does not have to be interrupted during transmission of the selected raw or compressed data out the data out line 203.

The present invention provides for many variations on the foregoing embodiments. A switch to raw data can be made to occur at different thresholds by adjusting the relative lengths of the FIFOs or by permitting the almost full indicator to be programmed to different lengths. The code injector can be a separate device or integrated into another component. For example, the raw data FIFO can include a read only memory preset so that the leading bits or the leading and the trailing bits of the raw data FIFO contents are the code identifying the transmitted data as raw data. The controller can include a provision for injecting the code itself or from the dictionary with a provision for bypassing the processed data FIFO.

In embodiments with provisions for FIFOs to be used in shifts, the switching can be performed by a variety of means. In some embodiments, one buffer can belong to two or more buffer pairs. For example, a data compression system can include one buffer which is always used as the processed data buffer, while two raw data buffers are used in alternation. These and other modifications to and variations of the foregoing embodiments are provided by the present invention, the scope of which is limited only by the following claims.

What is claimed is:

1. A system comprising:
   system input means for receiving raw data;
   system output means for transmitting data;
   a data compressor for providing processed data, said compressor including a compressor input for receiving raw data and a compressor output for transmitting processed data, said compression input of said data compressor being coupled to said system input means;
   processed data buffer means for storing processed data from said data compressor, said processed data buffer means having a processed data buffer input coupled to said compressor output and a processed data buffer output coupled to said system output, said processed data buffer including process data buffer full indicator means for providing a process data buffer full indication when a predetermined amount of processed data is stored therein;

raw data buffer means for storing raw data, said raw data buffer means having a raw data buffer input coupled to said system input means and a raw data buffer output coupled to said system output means, said raw data buffer means including raw data full indicator means for providing a raw data buffer full indication when a predetermined amount of data is stored therein; and controller means for controlling the flow of raw and processed data between said system input means and said system output means, said controller means including means for receiving full indications from said buffers and means for enabling the outputs of both said buffer means so that the contents of said processed data buffer means can be transmitted via said system output means in response to a full indication from said raw data buffer means and so that the contents of said raw data buffer means can be transmitted via said system output means in response to a full indication from said processed data buffer.

2. The system of claim 1 further comprising:

code injection means for outputting a predetermined code sequence via said system output means, said code injection means having an injection output coupled to said system output means, said controller means including means for activating said code injection means so as to transmit a code identifying data transmitted from said raw data buffer means as raw data.

3. The system of claim 1 wherein:

said processed data buffer means includes a first-in-first-out memory device; and said raw data buffer means includes a first-in-first-out memory device.

4. The system of claim 1 wherein:

said processed data buffer means includes first and second first-in-first-out memory devices and means for filling said first and second memory devices in alternation, and said raw data buffer means includes third and fourth first-in-first-out memory devices and means for filling said third and fourth memory devices in alternation.

5. A method comprising:

receiving raw data;

concurrently storing said raw data in a first memory device and processing said raw data according to a predetermined compression strategy and storing the resulting processed data in a second memory device;

determining which of said memory devices is the first to fill; and transmitting the contents of the other memory device.

6. A method comprising:

receiving raw data;

concurrently storing said raw data in a first memory device and processing said raw data according to a predetermined compression strategy and storing the resulting processed data in a second memory device;

determining which of said memory devices is the first to fill;

transmitting the contents of the other memory device; and transmitting a code to mark the transmitted contents as raw data when said second memory device is the first to fill.

* * * * *